US012585202B2

(12) United States Patent
Hattori

(10) Patent No.: US 12,585,202 B2
(45) Date of Patent: Mar. 24, 2026

(54) MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Tadashi Hattori, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 857 days.

(21) Appl. No.: 17/671,661

(22) Filed: Feb. 15, 2022

(65) Prior Publication Data

US 2022/0269186 A1    Aug. 25, 2022

(30) Foreign Application Priority Data

Feb. 19, 2021    (JP) ................................. 2021-025523

(51) Int. Cl.
*G01B 11/02*       (2006.01)
*G03F 7/00*        (2006.01)
(Continued)

(52) U.S. Cl.
CPC .......... *G03F 7/70775* (2013.01); *G01B 11/00* (2013.01); *G01B 11/02* (2013.01); (Continued)

(58) Field of Classification Search
CPC .. G03F 7/0002; G03F 9/7042; G03F 7/70775; G01B 11/026
See application file for complete search history.

(56) References Cited

U.S. PATENT DOCUMENTS 10,260,867 B2    4/2019  Yamamoto
2002/0048026 A1*  4/2002  Isshiki ................ G03F 7/70775
                                                    356/498
(Continued)

FOREIGN PATENT DOCUMENTS

CN        108253898 A    7/2018
JP        2006250826 A   9/2006
(Continued)

OTHER PUBLICATIONS

English Translation of JP 2008-309668 A; Komata Kimio; Published: Dec. 25, 2008 (Year: 2008).*
(Continued)

*Primary Examiner* — Mark F. Huff
*Assistant Examiner* — Richard David Champion
(74) *Attorney, Agent, or Firm* — ROSSI, KIMMS & McDOWELL LLP

(57)                ABSTRACT

The present invention provides a measurement apparatus that measures a position of an object, comprising: a detector configured to irradiate a measurement target point of the object with light having a plurality of wavelengths, and detect a position of the measurement target point based on the light reflected by the measurement target point; and a processor configured to determine the position of the object based on a detection result of the detector, wherein the detection result includes an error represented by a waveform in which an amplitude cyclically changes in accordance with a distance between the detector and the object, and wherein the processor is configured to cause the detector to detect the position of the measurement target point at the distance at which the amplitude in the waveform of the error falls within an allowable range.

9 Claims, 14 Drawing Sheets

(51) Int. Cl.

| | |
|---|---|
| *G01B 11/00* | (2006.01) |
| *H01L 21/027* | (2006.01) |
| *H01L 21/30* | (2006.01) |

(52) U.S. Cl.

CPC .......... *G01B 11/026* (2013.01); *G03F 7/0002* (2013.01); *H01L 21/027* (2013.01); *H01L 21/30* (2013.01)

(56) References Cited

U.S. PATENT DOCUMENTS

| | | | |
|---|---|---|---|
| 2006/0055899 A1* | 3/2006 | Van Der Net | ...... G03F 7/70883 |
| | | | 355/53 |
| 2010/0190115 A1 | 7/2010 | Kato et al. | |
| 2012/0206703 A1 | 8/2012 | Bhattacharyya et al. | |
| 2012/0326007 A1 | 12/2012 | Muto | |
| 2016/0061590 A1 | 3/2016 | Pandey | |
| 2016/0282282 A1 | 9/2016 | Quintanilha et al. | |
| 2016/0357116 A1* | 12/2016 | Shibazaki | ........... G03F 7/70775 |
| 2017/0120337 A1* | 5/2017 | Kanko | ............... G01B 9/02083 |
| 2018/0144995 A1 | 5/2018 | Kim et al. | |
| 2018/0188189 A1 | 7/2018 | Hwang | |
| 2018/0347964 A1 | 12/2018 | Inoue et al. | |
| 2019/0094368 A1 | 3/2019 | Kondo et al. | |

FOREIGN PATENT DOCUMENTS

| | | | |
|---|---|---|---|
| JP | 2008309668 A | * | 12/2008 |
| JP | 2010014536 A | | 1/2010 |
| JP | 2011203231 A | | 10/2011 |
| JP | 5138115 B2 | | 2/2013 |
| JP | 6655888 B2 | | 3/2020 |
| KR | 1020100094584 A | | 8/2010 |
| TW | 200741817 A | | 11/2007 |
| TW | 201245895 A | | 11/2012 |
| TW | 201614188 A | | 4/2016 |
| TW | 201702750 A | | 1/2017 |
| TW | 201908689 A | | 3/2019 |
| TW | 201915428 A | | 4/2019 |

OTHER PUBLICATIONS

Office Action issued in Taiwanese Appln. No. 111103268, issued Mar. 27, 2024. English translation provided.

* cited by examiner

F I G. 2A
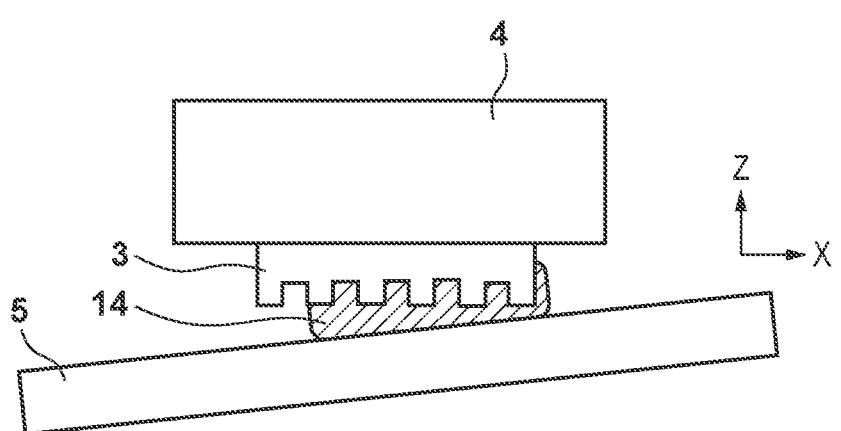
F I G. 2B
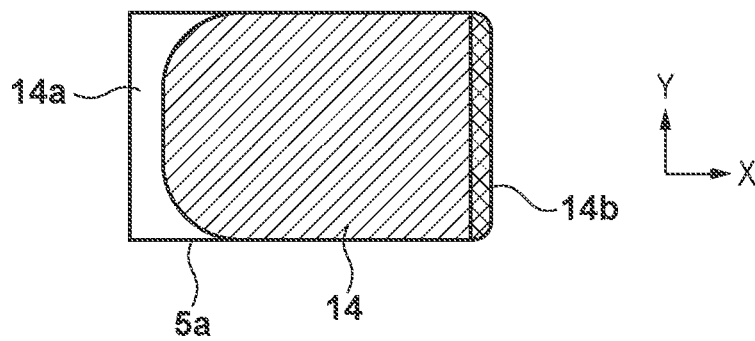

F I G. 4A
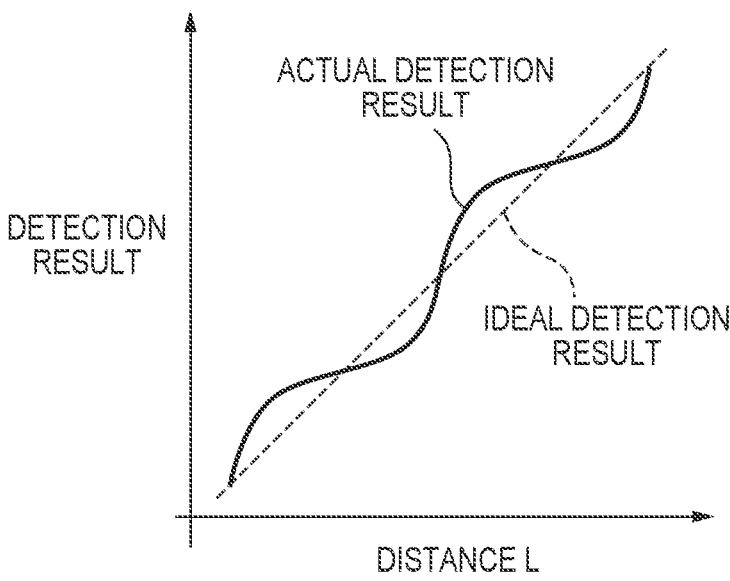
ACTUAL DETECTION RESULT
IDEAL DETECTION RESULT
DETECTION RESULT
DISTANCE L
F I G. 4B
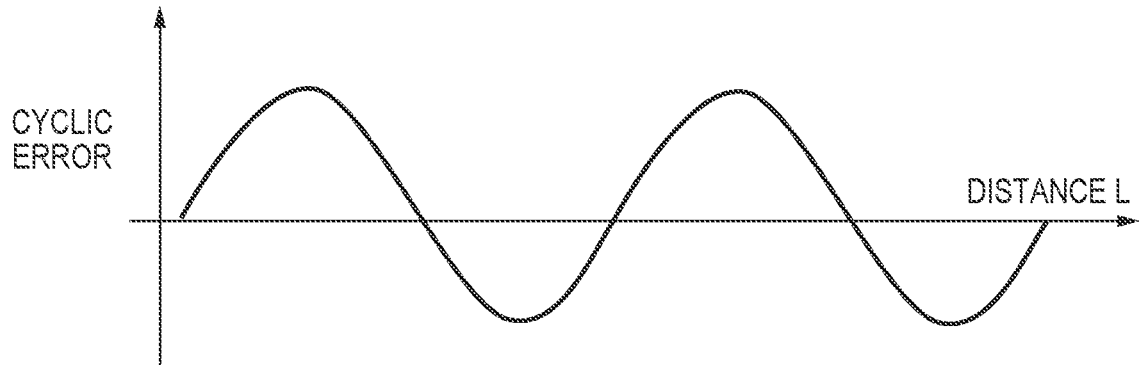
CYCLIC ERROR
DISTANCE L

F I G. 5A
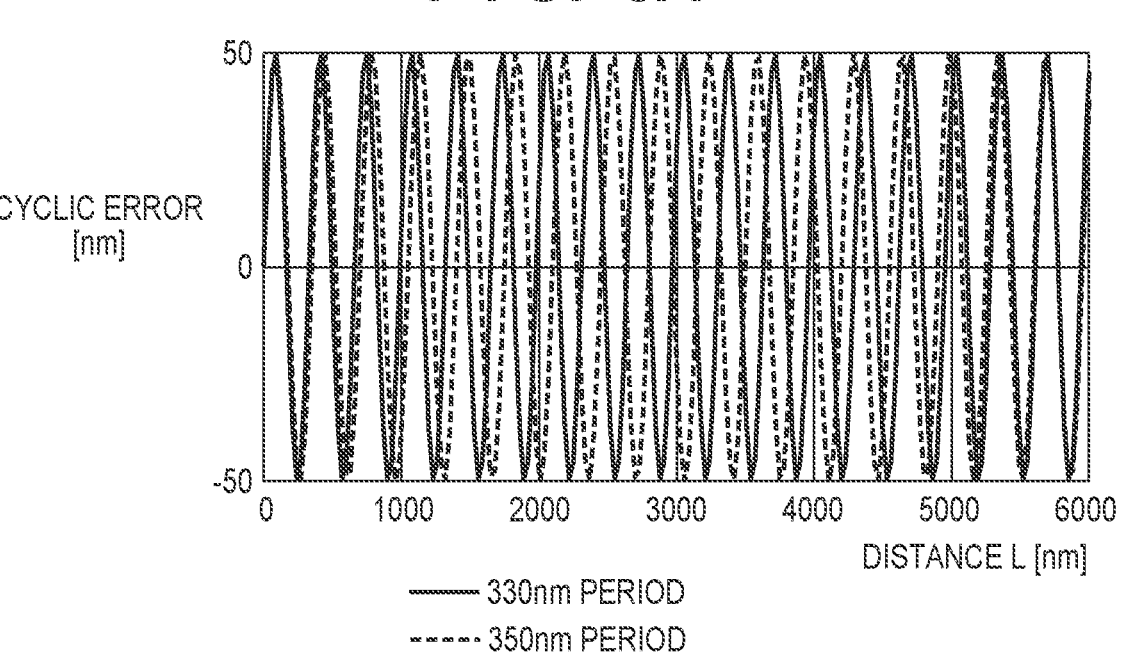
———— 330nm PERIOD
- - - - 350nm PERIOD
F I G. 5B
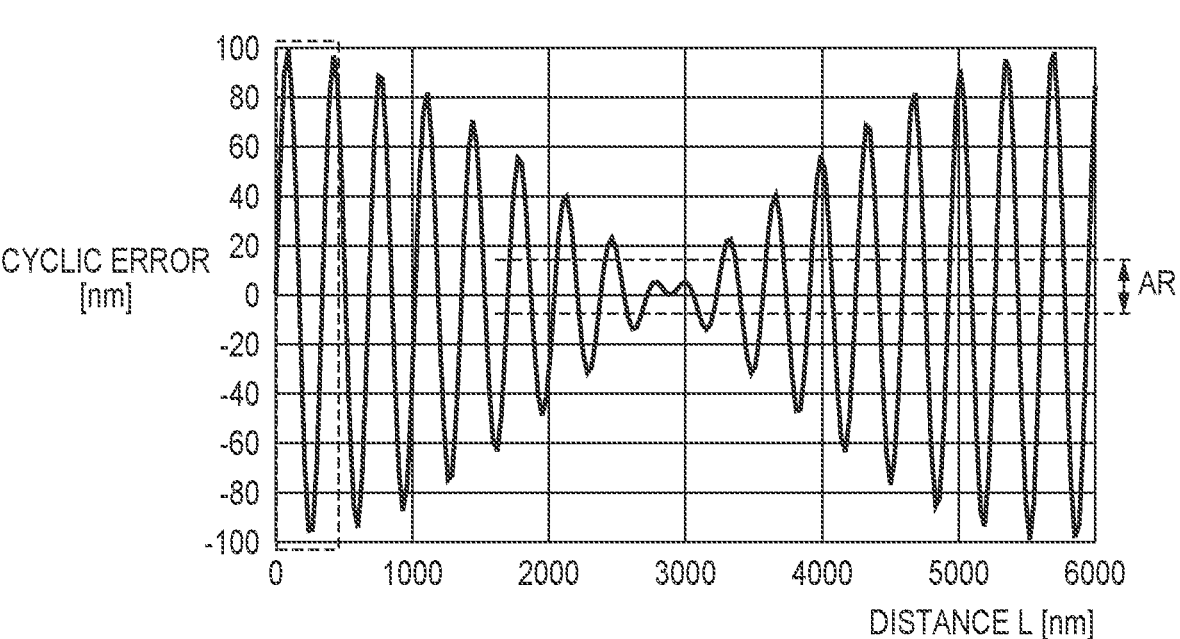

F I G. 7A
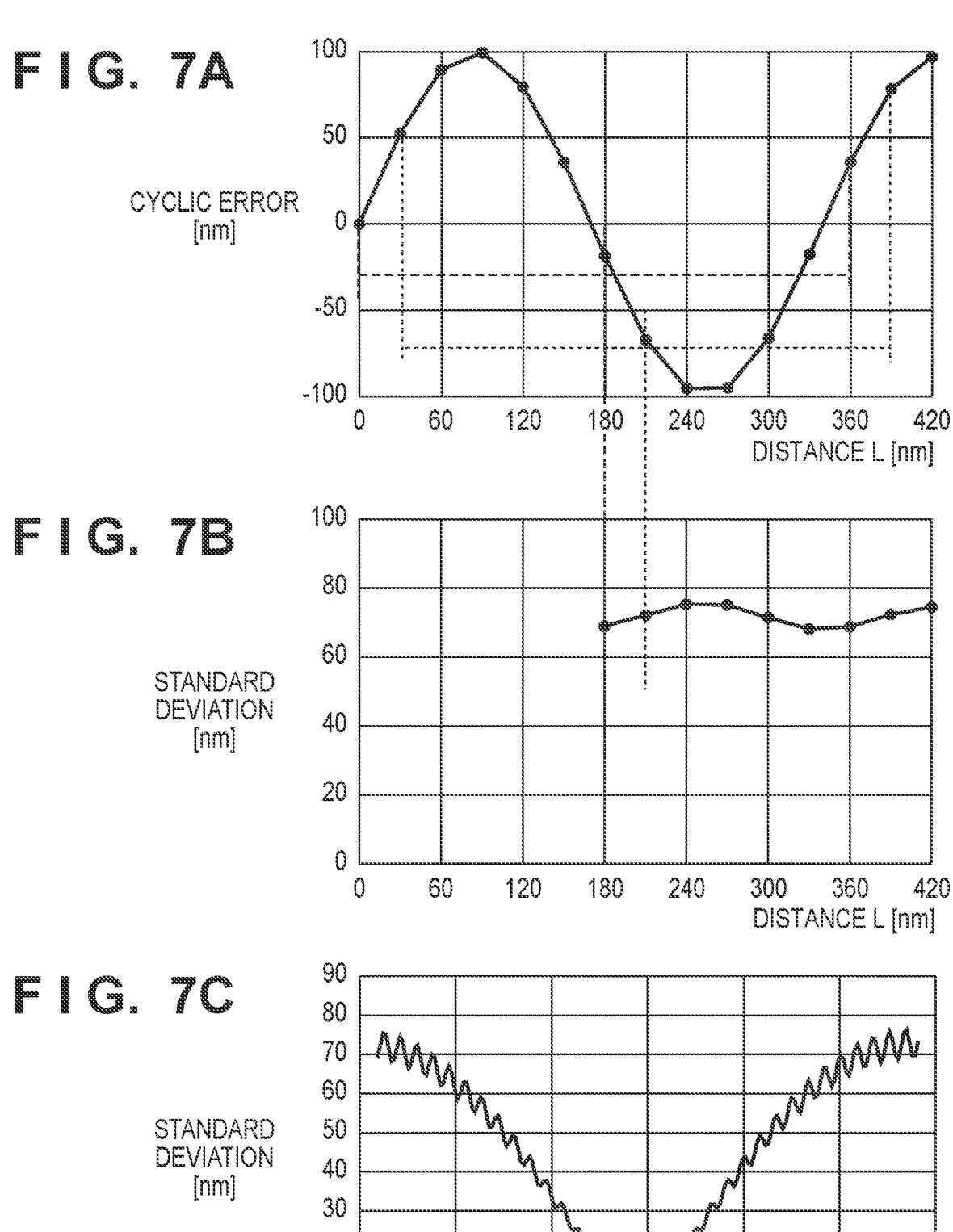
F I G. 7B
F I G. 7C

F I G. 10
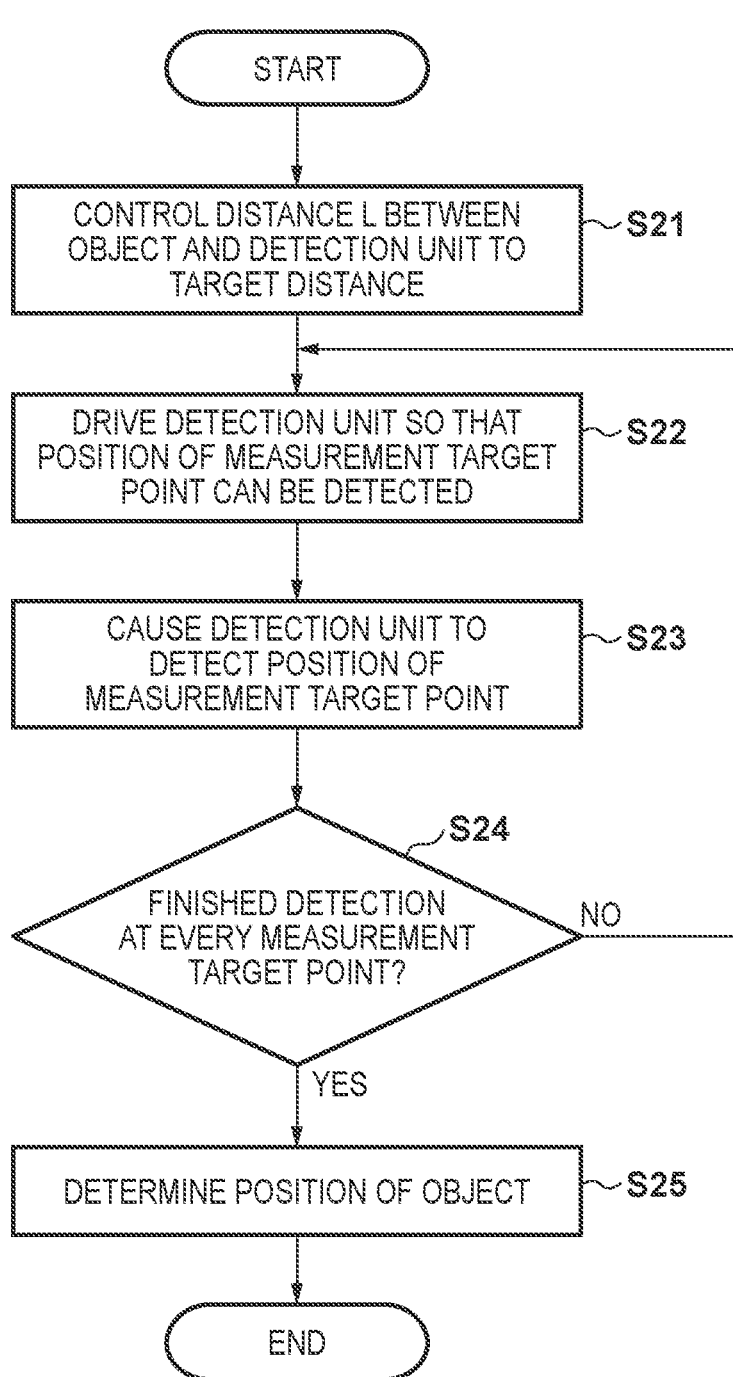

MEASUREMENT APPARATUS, LITHOGRAPHY APPARATUS, AND METHOD OF MANUFACTURING ARTICLE

BACKGROUND OF THE INVENTION

Field of the Invention

The present invention relates to a measurement apparatus, a lithography apparatus, and a method of manufacturing an article.

Description of the Related Art

There has been known a measurement apparatus (interferometer) that measures the position of an object based on an interference signal generated by the interference between the detection light reflected by the object (detection surface) and the reference light reflected by a reference surface. In such a measurement apparatus, a nonlinear error (also referred to as a cyclic error) which cyclically changes in accordance with the optical path length can be generated in a measurement result. Japanese Patent No. 6655888 discloses a method of measuring the position of an object in each of n types of states, in which the optical path lengths of detection light beams are different from each other by 1/n (n≥2) of the period of the error (cyclic error), and canceling the error using the measurement results obtained in the n types of states.

In the method of measuring the position of an object in each of n types of states as described in Japanese Patent No. 6655888, the measurement accuracy improves as the number of times of measurement (that is, the value of n) increases, but the throughput can decrease accordingly.

SUMMARY OF THE INVENTION

The present invention provides, for example, a technique advantageous in terms of measurement accuracy of the position of an object.

According to one aspect of the present invention, there is provided a measurement apparatus that measures a position of an object, comprising: a detector configured to irradiate a measurement target point of the object with light having a plurality of wavelengths, and detect a position of the measurement target point based on the light reflected by the measurement target point; and a processor configured to determine the position of the object based on a detection result of the detector, wherein the detection result includes an error represented by a waveform in which an amplitude cyclically changes in accordance with a distance between the detector and the object, and wherein the processor is configured to cause the detector to detect the position of the measurement target point at the distance at which the amplitude in the waveform of the error falls within an allowable range.

Further features of the present invention will become apparent from the following description of exemplary embodiments with reference to the attached drawings.

BRIEF DESCRIPTION OF THE DRAWINGS

FIGS. 2A and 2B are views for explaining non-filling and extrusion of an imprint material;

FIGS. 4A and 4B are graphs for explaining a cyclic error;

FIGS. 5A and 5B are graphs for explaining a cyclic error generated when light having a plurality of wavelengths is used;

FIGS. 7A to 7C are graphs for explaining an example in which the standard deviation of the cyclic error is obtained as an index value for each extraction section;

FIG. 10 is a flowchart illustrating a method of determining the position of an object;

DESCRIPTION OF THE EMBODIMENTS

Figure 1:
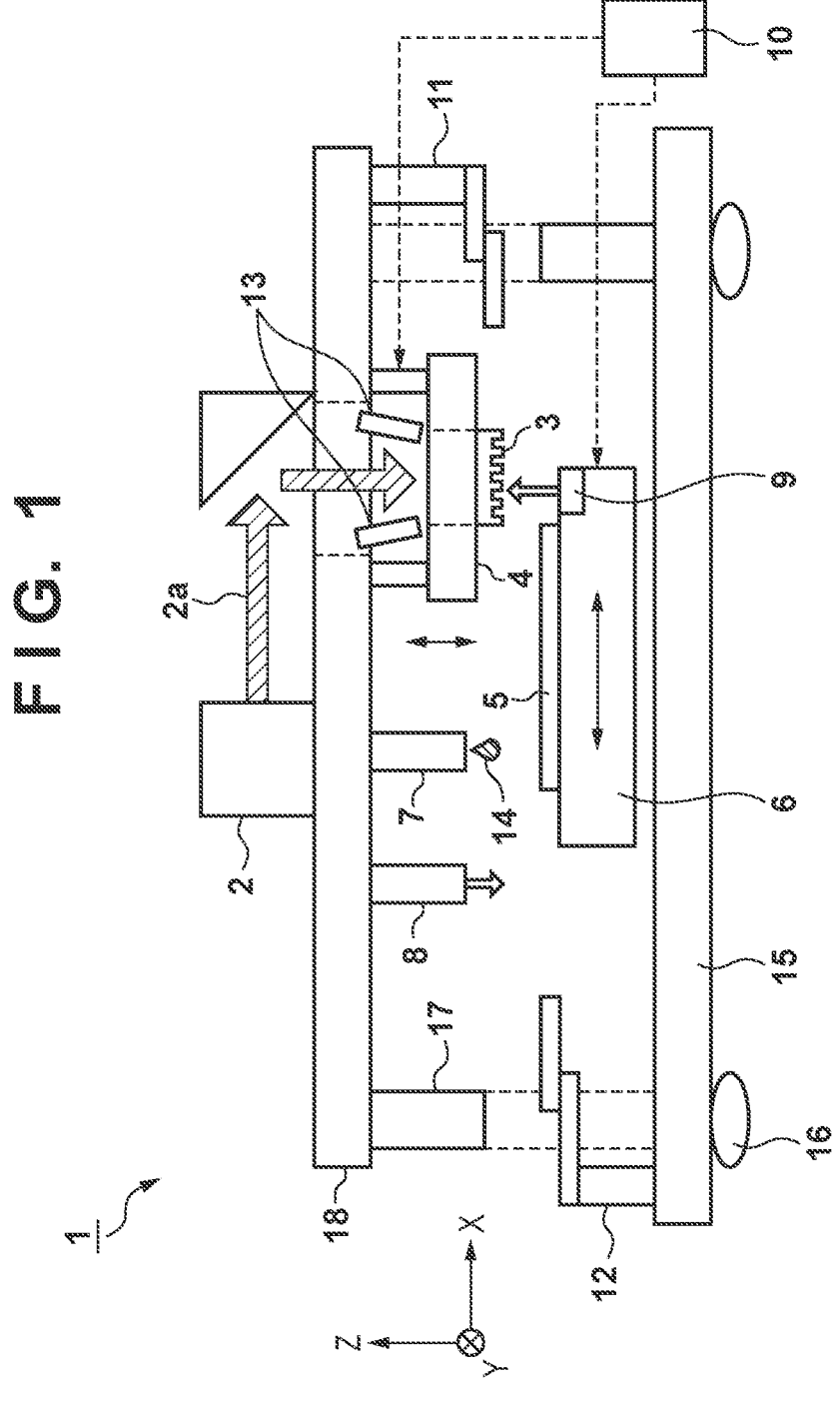
FIG. 1 is a schematic view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Although an imprint apparatus that forms an imprint material pattern on a substrate by using a mold will be exemplified as a lithography apparatus in the following embodiments, the present invention is not limited to this. The present invention is also applicable to other lithography apparatuses, for example, a planarization apparatus that planarizes a composition on a substrate by using a member, an exposure apparatus that exposes a substrate and transfers the pattern of an original onto the substrate, a drawing apparatus that uses a charged particle beam to form a pattern on a substrate, and the like.

First Embodiment

The first embodiment according to the present invention will be described. An imprint apparatus is an apparatus that brings a mold and an imprint material supplied onto a substrate into contact with each other and applies curing energy to the imprint material to form a pattern of a cured product to which a pattern having concave and convex portions of the mold has been transferred. For example, the imprint apparatus supplies an imprint material onto a substrate, and cures the imprint material in a state in which a mold on which a pattern having concave and convex portions has been formed is in contact with the imprint material on the substrate. Then, the imprint apparatus increases the spacing between the mold and the substrate, thereby separating the mold from the cured imprint material. Thus, a pattern layer of the imprint material can be formed on the substrate. This series of processes is called an "imprint process" and performed on each of a plurality of shot regions on the substrate.

As the imprint material, a curable composition (to be also referred to as a resin in an uncured state) to be cured by receiving curing energy is used. Examples of the curing energy are an electromagnetic wave, heat, and the like. The electromagnetic wave is light selected from the wavelength range of 10 nm (inclusive) to 1 mm (inclusive), for example, infrared light, a visible light beam, ultraviolet light, or the like.

The curable composition can be a composition cured with light irradiation or heating. A photo-curable composition cured by light irradiation contains at least a polymerizable compound and a photopolymerization initiator, and may further contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied onto the substrate in the form of a film by a spin coater or a slit coater. Alternatively, the imprint material may be applied onto the substrate in the form of droplets or in the form of an island or film obtained by connecting a plurality of droplets supplied by a liquid injection head. The viscosity (the viscosity at 25° C.) of the imprint material is, for example, 1 mPa·s (inclusive) to 100 mPa·s (inclusive).

[Imprint Apparatus]

FIG. 1 is a schematic view showing the arrangement of an imprint apparatus 1 according to this embodiment. In FIG. 1, a direction parallel to the optical axis of light applied to a mold 3 is assumed to be the Z-axis direction, and directions orthogonal to each other in a plane perpendicular to the Z-axis direction are assumed to be the X-axis direction and the Y-axis direction, respectively. Note that in the following description, the "X-axis direction" can be defined to include the +X direction and the −X direction. This also applies to the "Y-axis direction" and the "Z-axis direction".

The imprint apparatus 1 can include, for example, a curing unit 2, an imprint head 4, a stage 6, a supply unit 7, an observation unit 13, a first measurement unit 8, a second measurement unit 9, and a control unit 10 (controller). The control unit 10 is formed by, for example, a computer which includes a CPU, a memory, and the like, and the control unit 10 controls each unit of the imprint apparatus 1 (controls the imprint process). Here, the imprint head 4 is provided on a bridge plate 18 supported by a base plate 15 via a column 17. The stage 6 is provided so as to be movable on the base plate 15. The imprint apparatus 1 is provided with a vibration isolator 16 used to reduce a vibration transmitted to the base plate 15 from the floor on which the imprint apparatus 1 is installed.

The mold 3 (original) is usually formed from a material such as silica glass capable of transmitting ultraviolet light. A pattern having concave and convex portions to be transferred to the imprint material on the substrate is three-dimensionally formed in a partial region (pattern region) located on the substrate side surface. As a substrate 5, glass, ceramic, a metal, a semiconductor, a resin, or the like is used. A member made of a material different from that of the substrate may be formed on the surface of the substrate, as needed. More specifically, the substrate 5 is a silicon wafer, a semiconductor compound wafer, silica glass, or the like. An adhesive layer may be provided before the application of an imprint material to improve the adhesiveness between the imprint material and the substrate, as needed. The substrate 5 may be a blank mold in which no pattern has been formed yet.

In an imprint process, the curing unit 2 (irradiation unit) irradiates the imprint material on the substrate 5 with light (for example, ultraviolet light) via the mold 3 in a state in which the mold 3 and the imprint material on the substrate 5 are in contact with each other, thereby curing the imprint material. The curing unit 2 can include, for example, a light source and an optical element used to adjust the light emitted from the light source to light suitable for the imprint process. In the imprint apparatus 1 shown in FIG. 1, it is configured such that light 2a emitted from the curing unit 2 is reflected by a mirror and applied to the imprint material on the substrate 5.

The imprint head 4 can include a mold chuck that holds the mold 3 conveyed by a mold conveyance unit 11, and a mold driving unit configured to be capable of changing the position and tilt of the mold 3 held by the mold chuck. The mold driving unit can include, for example, a Z-driving mechanism that changes the spacing between the mold 3 and the substrate 5 by driving the mold 3 in the Z direction to press the mold 3 against the imprint material on the substrate 5 or separate the mold 3 from the cured imprint material. The mold driving unit may also include a tilt driving mechanism that tilts the mold 3, or the like.

The stage 6 is configured to be capable of holding and moving the substrate 5 on the base plate 15 in the X and Y directions. The stage 6 can include, for example, a substrate chuck that holds the substrate 5 conveyed by a substrate conveyance unit 12, and a substrate driving unit configured to be capable of changing the position and tilt of the substrate 5 held by the substrate chuck. The substrate driving unit can be formed by, for example, a driving mechanism that drives the substrate 5 in the X and Y directions, the Z direction, and the θ direction (the rotation direction around the Z axis) and/or a tilt driving mechanism that tilts the substrate 5.

In the imprint apparatus 1 according to this embodiment, an operation of changing the spacing between the mold 3 and the substrate 5 can be performed by driving the mold 3 in the Z direction by the imprint head 4. However, the present invention is not limited to this. This operation may be performed by, for example, driving the substrate 5 in the Z direction by the stage 6, or may be performed by relatively driving the mold 3 and the substrate 5 in the Z direction by the imprint head 4 and the stage 6, respectively.

The observation unit 13 includes, for example, a TTM (Through The Mold) scope that observes (detects) a relative positional shift between a mark provided on the mold 3 and a mark provided on the substrate 5. Thus, the control unit 10 can execute alignment between the mold 3 and the substrate 5 based on the relative positional shift between the mark of the mold 3 and the mark of the substrate 5 observed by the observation unit 13 (TTM scope). The supply unit 7 supplies an imprint material 14 (for example, an uncured resin) onto the substrate 5. In this embodiment, an ultraviolet curing resin having a property of being cured by irradiation of ultraviolet light can be used as the imprint material 14.

The first measurement unit 8 measures the height distribution of the surface (mold-side surface) of the substrate 5. For example, the first measurement unit 8 can include a laser interferometer that irradiates the substrate 5 with light (laser beam) and detects the height (Z-direction position) of a measurement target point of the substrate 5 irradiated with the light. The first measurement unit 8 can measure the height distribution of the surface of the substrate 5 by detecting the height at each of a plurality of measurement target points on the surface of the substrate 5 while moving the substrate 5 by the stage 6. For example, the surface shape of the substrate 5 and the tilt of the surface of the substrate 5 can be obtained from the height distribution of the surface of the substrate 5.

The second measurement unit 9 measures the height distribution of the surface (substrate-side surface) of the mold 3. For example, the second measurement unit 9 can include a laser interferometer that irradiates the mold 3 with light (laser beam) and detects the height (Z-direction position) of a measurement target point of the mold 3 irradiated with the light. The second measurement unit 9 is provided in the stage 6. The second measurement unit 9 can measure the height distribution of the surface of the mold 3 by detecting the height at each of a plurality of measurement target points on the surface of the mold 3 while being moved by the stage 6. For example, the surface shape of the mold 3 and the tilt of the surface of the mold 3 can be obtained from the height distribution of the surface of the mold 3.

[Measurement Apparatus (First Measurement Unit and Second Measurement Unit)]

In the imprint apparatus 1, if the mold 3 and the substrate 5 are relatively tilted during an imprint process as shown in FIG. 2A, non-filling 14a or extrusion 14b of the imprint material 14 may occur as shown in FIG. 2B. The non-filling 14a of the imprint material 14 means that the imprint material 14 is partially not filled inside a shot region 5a of the substrate 5. The extrusion 14b of the imprint material 14 means that the imprint material 14 extrudes to the outside of the shot region 5a of the substrate 5. Further, in this case, the residual layer thickness (the thickness between the concave portion of the pattern having concave and convex portions and the substrate 5) of the pattern having concave and convex portions, which is formed by the cured imprint material 14, may not be uniform, and this may affect post-processing such as etching processing which uses the pattern having concave and convex portions as a mask. Therefore, the imprint apparatus 1 according to this embodiment is provided with the first measurement unit 8 and the second measurement unit 9, and controlled based on the measurement results thereof such that the relative tilt between the mold 3 and the substrate 5 becomes a target relative tilt (for example, parallel).

Figure 3:
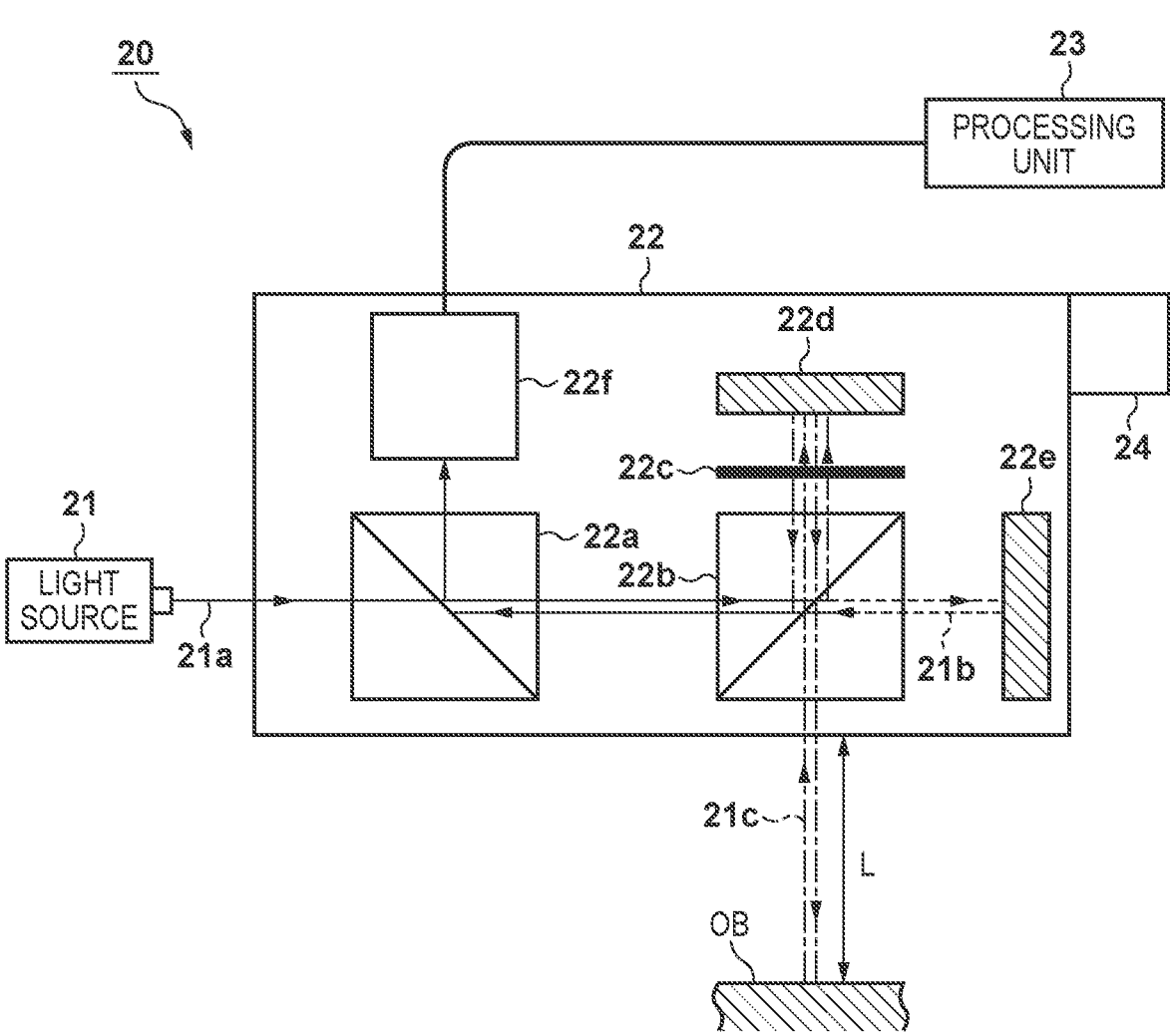
FIG. 3 is a schematic view showing an arrangement example of a measurement apparatus.

FIG. 3 is a schematic view showing an arrangement example of a measurement apparatus 20 used as the first measurement unit 8 and/or the second measurement unit 9. The measurement apparatus 20 is an apparatus that measures the position of an object OB (the substrate 5 or the mold 3) and can include, for example, a light source 21, a detection unit 22 (detector), and a processing unit 23 (processor). The light source 21 includes, for example, a laser light source, an LED, or the like, and emits light having a plurality of wavelengths. It may be understood that the light source 21 emits, as the light having the plurality of wavelengths, light having a certain degree of wavelength width (wavelength band). The detection unit 22 irradiates a measurement target point of the object OB with the light emitted from the light source 21, and detects the position of the measurement target point based on the light reflected by the measurement target point. The processing unit 23 is formed by, for example, a computer which includes a CPU (processor), a memory, and the like. The processing unit 23 controls each unit of the measurement apparatus 20, and determines the position of the object OB based on the detection result of the detection unit 22. In this embodiment, the processing unit 23 can be configured to perform, in addition to determination of the position of the object OB, control (adjustment) of a distance L between the detection unit 22 and the object OB. Control of the distance L may be performed by, for example, driving the imprint head 4 and/or the stage 6. Alternatively, a driving mechanism 24 that drives the detection unit 22 may be provided, and control of the distance L may be performed by the driving mechanism 24. The processing unit 23 may be formed as a part of the control unit 10 of the imprint apparatus 1.

The light source 21 includes a semiconductor laser, a solid state laser, or the like, and emits light. In this embodiment, the light source 21 is configured to emit a laser beam 21a having a plurality of wavelengths (for example, a wavelength of 660 nm and a wavelength of 700 nm). The detection unit 22 can include, for example, a beam splitter 22a, a polarization beam splitter 22b, a $\lambda/4$ plate 22c, a mirror 22d, a reference surface 22e, and a light receiver 22f. The laser beam 21a emitted from the light source 21 and incident on the detection unit 22 is transmitted through the beam splitter 22a, and then divided into light including a P-polarized light component and light including an S-polarized light component by the polarization beam splitter 22b. One of the light including the P-polarized light component and the light including the S-polarized light component is transmitted through the polarization beam splitter 22b and incident on the reference surface 22e. The light reflected by the reference surface 22e is transmitted through the polarization beam splitter 22b and incident on the beam splitter 22a. In the following description, the light reflected by the reference surface 22e will be referred to as reference light 21b.

On the other hand, the other one of the light including the P-polarized light component and the light including the S-polarized light component is reflected by the polarization beam splitter 22b and incident on the $\lambda/4$ plate 22c, the polarization direction of the light is rotated by 90°, and the light is incident on the mirror 22d. The light reflected by the mirror 22d is incident on the $\lambda/4$ plate 22c again, the polarization direction of the light is rotated by 90°, and the light is incident on the polarization beam splitter 22b. Since this light has the polarization direction rotated by 180° from the polarization direction of light which is reflected by the polarization beam splitter 22b, it is transmitted through the polarization beam splitter 22b and applied to the object OB (measurement target point). The light reflected by the object OB (measurement target point) is transmitted through the polarization beam splitter 22b and incident on the $\lambda/4$ plate 22c, the polarization direction of the light is rotated by 90°, and the light is incident on the mirror 22d. The light reflected by the mirror 22d is incident on the $\lambda/4$ plate 22c again, the polarization direction of the light is rotated by 90°, and the light is incident on the polarization beam splitter 22b. Since this light has the polarization direction rotated by 180° from the polarization direction of light which is transmitted through the polarization beam splitter 22b, it is reflected by the polarization beam splitter 22b and incident on the beam splitter 22a. In the following description, the light reflected by the object OB will be referred to as detection light 21c.

The reference light 21b and the detection light 21c incident on the beam splitter 22a and reflected by the beam splitter 22a form interference light, and the interference light is incident on the light receiver 22f. The light receiver 22f includes a light receiving sensor that receives the interference light, and detects the position (height) of the measurement target point of the object OB based on the interference light (interference signal) received by the light receiving sensor. Thus, the detection unit 22 can detect the position of the measurement target point of the object OB. Based on the detection result of the detection unit 22, the processing unit 23 determines the position (height) of the object OB. The processing unit 23 can obtain the tilt and shape of the object OB by determining the position of each of a plurality of measurement target points in the object OB.

In the measurement apparatus 20 configured as described above, it is known that a nonlinear error (also referred to as a cyclic error) which cyclically changes in accordance with the distance L between the detection unit 22 and the object OB (measurement target point) can be generated in the measurement result of the detection unit 22. FIG. 4A is a graph in which the abscissa represents the distance L between the detection unit 22 and the object OB and the ordinate represents the detection result (the detection value or the output value) of the detection unit 22. The ideal relationship between the distance L and the detection result of the detection unit 22 is the linear relationship as indicated by a dashed line in FIG. 4A. However, as indicated by a solid line in FIG. 4A, the actual relationship has the characteristic (value) including a nonlinear component which cyclically changes in accordance with the distance L. This nonlinear component is the cyclic error. FIG. 4B shows the result obtained by extracting the difference between the ideal value (dashed line) and the measured value (solid line) shown in FIG. 4A, that is, the cyclic error. It can be seen that the cyclic error has a sine wave or a waveform close to a sine wave with respect to the distance L as shown in FIG. 4B. An amplitude A of this waveform depends on the configuration of the measurement apparatus 20, and may be, for example, several tens of nm, or more than 100 nm in some cases. A period (cycle) T of the waveform depends on the wavelength of the light (that is, the wavelength of the light source 21) used in the measurement apparatus 20. For example, when a 600 nm red laser is used as the light source 21, the period T can be 300 nm, 150 nm, or a combination thereof. Note that the amplitude A can be defined as the peak value (absolute value) of the waveform in one period.

Here, the present inventor has found that when light having a plurality of wavelengths (this may be understood as light of a wavelength band having a predetermined width) is used as the light 21a emitted from the light source 21 of the measurement apparatus 20, the cyclic error partially becomes small due to the interaction of the plurality of wavelengths. When light having a plurality of wavelengths is used in the measurement apparatus 20, the cyclic error is a combination of components depending on the plurality of wavelengths. As an example, assume that light having a wavelength of 660 nm and a wavelength of 700 nm is used and, for the sake of illustrative simplicity, the ½ component of the light source wavelength is dominant in the cyclic error. In this case, the cyclic error has a combined waveform formed by the component having a period of 330 nm derived from the light having the wavelength of 660 nm and the component having a period of 350 nm derived from the light having the wavelength of 700 nm.

FIGS. 5A and 5B are graphs for explaining a cyclic error generated when light having a plurality of wavelengths (a wavelength of 660 nm and a wavelength of 700 nm) is used. In each of FIGS. 5A and 5B, the abscissa represents the distance L between the detection unit 22 and the object OB, and the ordinates represents the cyclic error. FIG. 5A shows an example in which the waveform of the cyclic error (the component having a period of 330 nm: solid line) derived from the light having the wavelength of 660 nm and the waveform of the cyclic error (the component having a period of 350 nm: dashed line) derived from the light having the wavelength of 700 nm are individually shown. In FIG. 5A, for the sake of illustrative simplicity, the amplitudes of the cyclic errors are both 50 nm. FIG. 5B shows the waveform of the cyclic error which is obtained in practice when the light having both of the wavelength of 660 nm and the wavelength of 700 nm is used. Note that each of FIGS. 5A and 5B shows the waveform of the cyclic error with respect to the distance L, which is partially (locally) extracted in the range of the distance L from 0 to 6,000 nm. In the range of the distance L equal to or larger than the 6,000 nm, the waveform shown in each of FIGS. 5A and 5B repeatedly appears.

As can be seen from FIG. 5B, when the light having the wavelength of 660 nm and the wavelength of 700 nm is used, the waveform of the cyclic error obtained in practice is a combined waveform formed by the cyclic errors deprived from the light beams having the respective wavelengths shown in FIG. 5A. That is, the waveform of the cyclic error obtained in practice is the waveform in which the amplitude A cyclically changes in accordance with the distance L due to the interaction of the plurality of wavelengths, and a portion where the cyclic errors strengthen each other and a portion where the cyclic errors weaken each other appear. In the waveform shown in FIG. 5B, the amplitude A tends to decrease as the distance L increases in the range of the distance L from 0 to 2,900 nm, and the amplitude A tends to increase as the distance L increases in the range of the distance L from 2,900 nm to 5,800 nm. That is, the cyclic error tends to become small near the distance L of 2,900 nm. It may also be understood that the waveform shown in FIG. 5B is a waveform including a high frequency component (the fine fluctuation of the cyclic error) which fluctuates in a period of about 350 nm, and a low frequency component (the fluctuation of the amplitude A) which fluctuates in a period of about 5,800 nm.

Accordingly, the measurement apparatus 20 (processing unit 23) in this embodiment causes the detection unit 22 to detect the position of the measurement target point of the object OB at the distance L at which the amplitude A in the waveform of the cyclic error falls within an allowable range (within an allowable range AR). For example, the processing unit 23 determines a target distance between the detection unit 22 and the object OB such that the amplitude A (low frequency component) in the waveform of the cyclic error falls within the allowable range AR, and causes the detection unit 22 to detect the position of the measurement target point of the object OB at the target distance. With this, it is possible to reduce the cyclic error included in the detection result of the detection unit 22, and accurately measure the position of the object OB. Note that the allowable range can be set arbitrarily. For example, the allowable range can be set to be equal to or smaller than half (50%) of the maximum value of the cyclic error (absolute value) which can be generated in the measurement result, preferably equal to or smaller than 30% of the maximum value, and more preferably, equal to or smaller than 10% of the maximum value.

[Method of Determining Target Distance]

Figure 6:
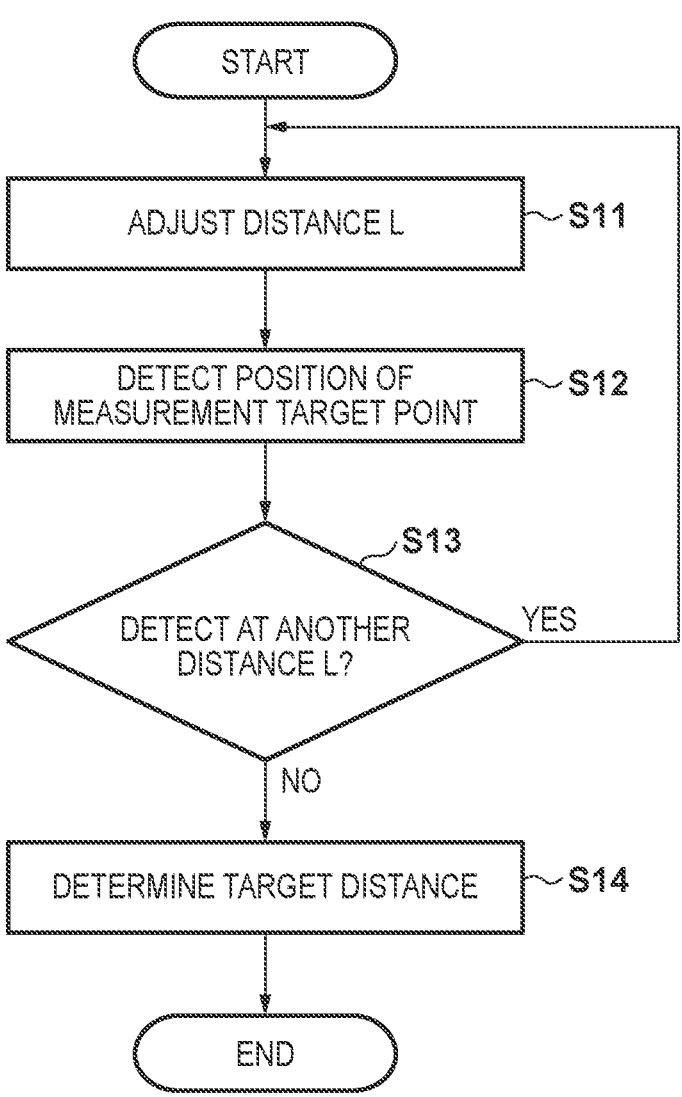
FIG. 6 is a flowchart illustrating a method of obtaining the waveform of the cyclic error and determining a target distance.

Next, a method of obtaining the waveform of the cyclic error as shown in FIG. 5B, and determining the target distance (to be sometimes simply referred to the target distance hereinafter) between the detection unit 22 and the object OB. FIG. 6 is a flowchart illustrating a method of obtaining the waveform of the cyclic error and determining the target distance. Obtainment of the waveform of the cyclic error and determination of the target distance can be performed in advance prior to an imprint process such as the time of activation of the apparatus or maintenance of the apparatus. In the following description, the mold 3 is exemplified as the object OB, and an example will be described in which the second measurement unit 9 formed as the measurement apparatus 20 described above measures the position (height) of the mold 3.

In step S11, the processing unit 23 adjusts the distance L between the second measurement unit 9 (detection unit 22) and the mold 3. For example, the processing unit 23 adjusts the distance L such that the mold 3 is arranged near the height at which the second measurement unit 9 measures the surface of the mold 3 in practice. Adjustment of the distance L can be performed by driving the imprint head 4 in the Z-axis direction. At this time, it is preferable that the second measurement unit 9 and the mold 3 are brought as close as possible so as to reduce the influence of air fluctuation, that is, the distance L is set to a value as small as possible within the measurement range of the second measurement unit 9. However, if the distance L is too small, the imprint head 4 (mold 3) and the stage 6 (the substrate 5 or the second measurement unit 9) may contact (interfere) each other, so that the distance L is set such that they do not contact each other. As an example, the distance L can be set to a spacing of about several tens of μm to several hundred μm (the spacing between the mold 3 and the second measurement unit 9). Further, in step S11, the X-direction position and the Y-direction position of the second measurement unit 9 can be adjusted by the stage 6 such that the second measurement unit 9 measures the central portion of the mold 3 as the measurement target point.

In step S12, the processing unit 23 causes the detection unit 22 to detect the surface height of the mold 3 (the position of the measurement target point), and stores the distance L and the detection result (surface height) in association with each other. Then, in step S13, the processing unit 23 determines whether to change the distance L and cause the detection unit 22 to continue detection of the surface height of the mold 3. For example, if the waveform of the cyclic error including a change of the amplitude A of one or more periods (for example, the waveform shown in FIG. 5B) has not been obtained, the processing unit 23 can determine to change the distance L and continue detection of the surface height of the mold 3. In this case, the process returns to step S11, and the processing unit 23 changes (adjusts) the distance L to the next distance L by driving the imprint head 4 in the Z-axis direction while fixing the X-direction position and the Y-direction position of the stage 6 (second measurement unit 9), and causes the detection unit 22 to detect the surface height of the mold 3 (measurement target point).

Here, the change amount of the distance L is required to be sufficiently smaller than the period (the period of the low frequency component) of the cyclic error in the second measurement unit 9 (detection unit 22). When the period of the cyclic error is about 300 to 400 nm, the change amount of the distance L (the Z-driving pitch of the imprint head 4) can be set to about several tens of nm. In each of a plurality of states in which the distance L is changed as described above, detection of the surface height of the mold 3 in steps S11 and S12 is repeatedly performed. The range of repeating detection of the surface height of the mold 3 depends on the second measurement unit 9. For example, in the waveform of the cyclic error, as shown in FIG. 5B, the distance L at which the amplitude A of the cyclic error becomes small and the distance L at which the amplitude A of the cyclic error becomes large alternately (cyclically) appear every several μm to several tens of μm. Therefore, detection of the surface height of the mold 3 is repeated in a range larger than the range in which a change of the amplitude A of one period can be seen. Note that it takes a considerable amount of time to repeatedly perform detection of the surface height of the mold 3 in this manner, it is desirable to perform steps S11 to S13 at the time of adjustment of the apparatus prior to performing an imprint process in practice.

In step S14, the processing unit 23 determines the target distance based on the waveform of the cyclic error obtained by repeating steps S11 to S13. For example, the processing unit 23 determines the target distance such that the amplitude A of the waveform of the cyclic error falls within the allowable range AR.

As an example of the method of determining the target distance, there is a method in which the section (to be sometimes referred to as an extraction section hereinafter) for extracting a part of the waveform of the cyclic error is set, and an index value indicating the magnitude of the cyclic error is obtained for each extraction section while changing the extraction section. In this method, by finding the extraction section in which the minimum index value is obtained, it is possible to determine the target distance within this extraction section. Here, a condition for the extraction section is that it at least includes the cyclic error of one period. For example, in the example shown in FIG. 5B, since the period (the period of the high frequency component) of the cyclic error is between 350 nm and 360 nm, a range of 360 nm or more can be defined as the extraction section. Further, the index value indicating the magnitude of the cyclic error in the extraction section may be the standard deviation of the cyclic error in the extraction section, or may be the difference (that is, the range) between the maximum value and the minimum value of the cyclic error in the extraction section. Examples of obtaining the index value for each extraction section will be described below.

Example 1

In Example 1, an example will be described in which the standard deviation of the cyclic error is obtained as the index value for each extraction section. FIG. 7A shows an enlarged graph of a part (the range surrounded by dashed lines) of the waveform shown in FIG. 5B, and FIG. 7B is a graph showing the result of obtaining the standard deviation of the cyclic error as the index value for each extraction section. FIGS. 7A and 7B show an example in which steps S11 to S13 were performed while the detection pitch of the surface height of the mold 3 by the detection unit 22 (the pitch of the distance L) was set to 30 nm. The extraction section is defined as a section of the distance L and can be arbitrarily set. In the following description, the extraction section is set to a section of 360 nm which is larger than the period (the period of the high frequency component) of the cyclic error. More specifically, the extraction section of the distance L used to obtain the index value for a given sample point (detection result) is set to a section of ±180 nm from the sample point. Note that with respect to each sample point at the distance L from 0 nm to 150 nm, the section of −180 nm from the sample point cannot be secured. Therefore, the sample point at the distance L of 180 nm is set as the starting point.

As shown in FIG. 7A, with respect to the sample point (detection result) at the distance L of 180 nm, the processing unit 23 sets, as the extraction section, the section of ±180 nm from the sample point, that is, the section from 0 nm to 360 nm. Then, the standard deviation of a plurality of detection results included in this extraction section is obtained as the index value and, as shown in FIG. 7B, the obtained index value is plotted at the position where the distance L is 180 nm. Similarly, with respect to the sample point (detection result) at the distance L of 210 nm, the processing unit 23 sets, as the extraction section, the section of ±180 nm from the sample point, that is, the section from 30 nm to 390 nm. Then, the standard deviation of a plurality of detection results included in the extraction section is obtained as the index value, and the obtained index value is plotted at the position where the distance L is 210 nm. By repeating the processing as described above for respective sample points, it is possible to generate index value information indicating the relationship between the distance L and the index value (standard deviation) as shown in FIG. 7C. With this, in the index value information shown in FIG. 7C, the processing unit 23 can determine, as the target distance, the distance L at which the index value (standard deviation) is equal to or smaller than a threshold value, for example, the distance L at which the index value is minimum. In the example shown in FIG. 7C, the index value is minimum at the distance L of 2,900 nm, so that the processing unit 23 can set the distance L of 2,900 nm as the target distance.

Here, as has been described above, in a range in which the distance L is less than 180 nm from the distance L in the first measurement, the extraction section cannot be set so the index value cannot be obtained. Similarly, in a range in which the distance L is less than 180 nm from the distance L in the last measurement, the extraction section cannot be set so the index value cannot be obtained. Accordingly, if the point where the index value is minimum is included in either of these ranges, it can be difficult to obtain, as the target distance, the point where the index value is minimum. Therefore, the range of the distance L in which the surface height is repeatedly detected in steps S11 to S13 is preferably set to a sufficiently large range so as to include the point where the index value is minimum.

Example 2

Figures 8A, 8B, 8C:
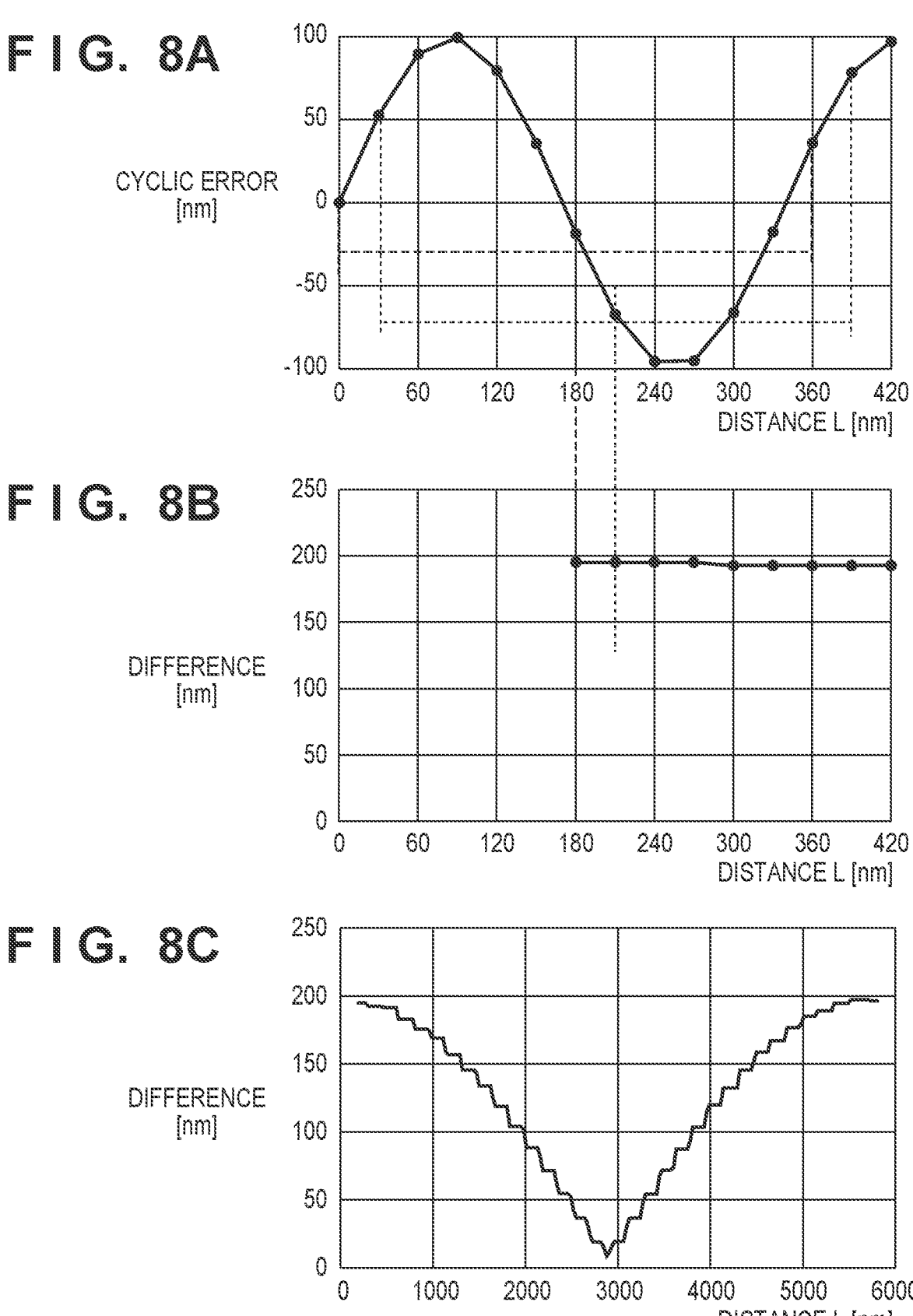
FIGS. 8A to 8C are graphs for explaining an example in which the difference between the maximum value and the minimum value of the cyclic error is obtained as the index value for each extraction section.

In Example 1, the standard deviation of the cyclic error in the extraction section is used as the index value. In Example 2, an example will be described in which the difference between the maximum value and the minimum value of the cyclic error in the extraction section is used as the index value. Also in a case in which the difference is used as the index value, processing similar to that in the case of using the standard deviation as the index value can be performed. FIG. 8A shows an enlarged graph of a part (the range surrounded by dashed lines) of the waveform shown in FIG. 5B, and FIG. 8B is a graph showing the result of obtaining, as the index value, the difference between the maximum value and the minimum value of the cyclic error for each extraction section.

As shown in FIG. 8A, with respect to the sample point (detection result) at the distance L of 180 nm, the processing unit 23 sets, as the extraction section, the section of ±180 nm from the sample point, that is, the section from 0 nm to 360 nm. Then, the difference between the maximum value and the minimum value of a plurality of detection results included in the extraction section is obtained as the index value and, as shown in FIG. 8B, the obtained index value is plotted at the position where the distance L is 180 nm. Similarly, with respect to the sample point (detection result) at the distance L of 210 nm, the processing unit 23 sets, as the extraction section, the section of ±180 nm from the sample point, that is, the section from 30 nm to 390 nm. Then, the difference between the maximum value and the minimum value of a plurality of detection results included in the extraction section is obtained as the index value, and the obtained index value is plotted at the position where the distance L is 210 nm. By repeating the processing as described above for respective sample points, it is possible to generate index value information indicating the relationship between the distance L and the index value (the difference between the maximum value and the minimum value) as shown in FIG. 8C. With this, in the index value information shown in FIG. 8C, the processing unit 23 can determine, as the target distance, the distance L at which the index value (difference) is equal to or smaller than a threshold value, for example, the distance L at which the index value is minimum. In the example shown in FIG. 8C, the index value is minimum at the distance L of 2,900 nm, so that the processing unit 23 sets the distance L of 2,900 nm as the target distance.

Example 3

Figure 9:
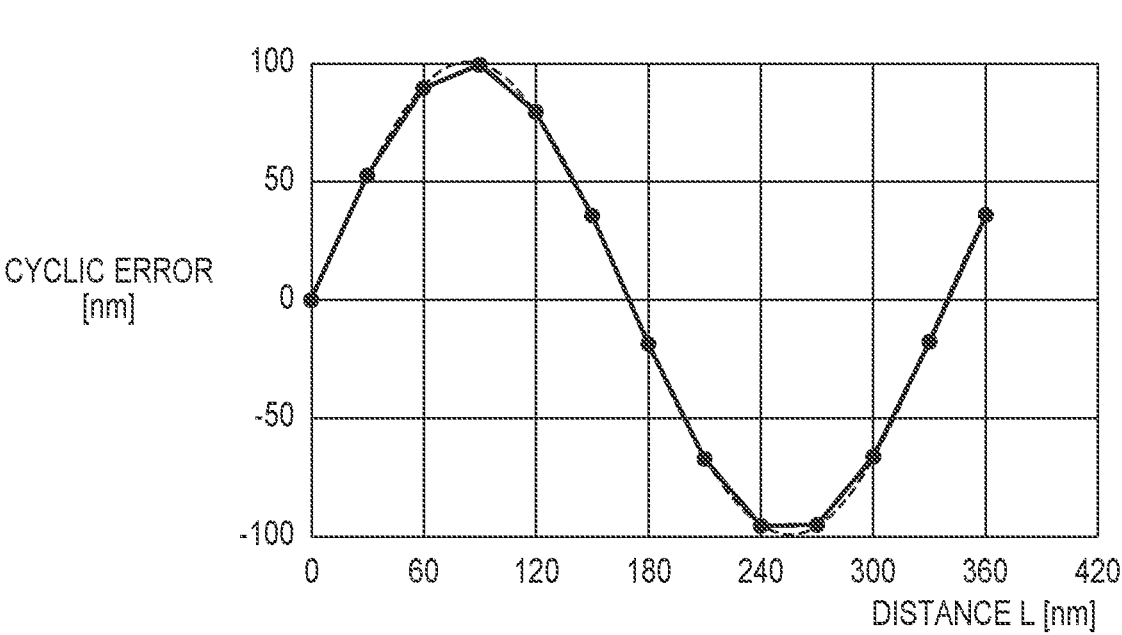
FIG. 9 is a graph for explaining an example in which an amplitude obtained by performing function approximation of the waveform of the cyclic error with a sine wave is obtained as the index value for each extraction section.

The method of obtaining, as the index value, the magnitude of the cyclic error in the extraction section is not limited to Examples 1 and 2 described above. For example, the amplitude obtained by performing function approximation of the waveform in the extraction section with a sine wave may be used as the index value. The method of setting the extraction section is as described above. FIG. 9 shows the approximation result (dashed line) obtained by performing function approximation of the detection results included in the first extraction section (from 0 nm to 360 nm) with a sine wave. In this manner, the amplitude of the approximation result is obtained as the index value for each extraction section while changing the extraction section, and the distance L at which the index value (amplitude) is minimum can be set as the target distance.

Here, the detection result of the detection unit 22 in the second measurement unit 9 may include various error components in addition to the cyclic error. For example, a drift of the stage 6 in the Z-axis direction and an error of a sensor (linear encoder or the like) that detects the position of the imprint head 4 in the Z-axis direction can be error components in the detection result of the detection unit 22. Therefore, in order to obtain the graph of FIG. 5B, it is necessary to extract the cyclic error component alone. Since the period of the cyclic error depends on the wavelength of the light source 21 of the measurement apparatus 20, the cyclic error component can be extracted by performing filter processing based on the wavelength of the light source 21, or the like. The period of the cyclic error is about 300 nm to 400 nm in the example described above, so that its frequency is higher than that of an error component such as a general drift of the stage 6 or a general error of the sensor. Hence, the detection unit 22 of the second measurement unit 9 can extract the frequency component regarding the cyclic error by applying a high-pass filter to the detection result. When noise having a higher frequency than the cyclic error is included in the detection result of the detection unit 22, a bandpass filter may be used to extract only the frequency component of the cyclic error. As a result, the waveform as shown in FIG. 5B can be obtained.

The abscissa of each graph represents the distance L between the detection unit 22 and the object OB (measurement target point). As the distance L, the distance obtained from the driving instruction value of the imprint head 4 or the output value (detection value) of a sensor that detects the distance between the detection unit 22 and the object OB can be used, but it is desirable to use the output value of the sensor. This is because the magnitude of the cyclic error included in the output value of the sensor has a large correlation with the output value of the sensor. When the single mold 3 is continuously used, the position of the imprint head 4 in the Z-axis direction may be used as the reference. However, if the mold 3 is replaced, the thickness of the mold 3, that is, the output value of the sensor usually changes. If the position of the imprint head 4 in the Z-axis direction at which the cyclic error is minimum is obtained every time the mold 3 is replaced, this takes time and the efficiency is low. When the abscissa of the graph represents the output value of the sensor, even if the thickness of the mold 3 changes, it is only required to drive the position of the imprint head 4 in the Z-axis direction to the target distance at which the cyclic error falls within the allowable range AR. Note that the output value of the sensor may also include error components including the cyclic error. However, as has been described above, these error components are about several tens of nm to hundred nm. Since the range in which the cyclic error becomes small has a certain degree of width such as a range of several 100 nm to several μm, a shift of several tens of nm to hundred nm is allowable.

Also in each of the examples shown in FIGS. 5A and 5B, FIGS. 7A to 7C, FIGS. 8A to 8C, and FIG. 9, it is desirable that the abscissa represents the output value of the sensor. In this case, the position where the output value of the sensor is about 2,900 nm can be calculated as the position at which the cyclic error becomes small. As has been described above, when the second measurement unit 9 measures the surface of the mold 3, measurement is usually performed in a state in which there is a spacing of several tens of μm or several hundred μm between the mold 3 and the second measurement unit 9 to prevent a collision upon driving the stage 6. FIGS. 5A and 5B, FIGS. 7A to 7C, FIGS. 8A to 8C, and FIG. 9 are merely conceptual views which help understanding of the present invention. In practice, the sensor measurement value at which the cyclic error is minimum is searched for near the position of the imprint head 4 in the Z-axis direction at the time of measurement.

The graph of standard deviation may include a calculation error depending on the width of calculating the standard deviation. As a result, the wavy shape as shown in FIG. 7C is obtained. Then, the calculation for obtaining the minimum value also includes an error. To prevent this, it is desirable to obtain the sensor measurement value at which the cyclic error is minimum after the error is removed by applying a low-pass filter or the like to the graph.

[Method of Determining Position of Object]

Next, a method of measuring the position (height) at each of a plurality of measurement target points in the object OB using the target distance determined using the flowchart of FIG. 6, and determining the position of the object OB from the measurement results will be described. It may be understood that the position of the object OB includes the surface shape and/or the surface tilt of the object OB. FIG. 10 is a flowchart illustrating a method of determining the position of the object OB. In the following description, the mold 3 will be exemplified as the object OB, and an example will be described in which the second measurement unit 9 formed as the measurement apparatus 20 described above measures the position of the mold 3. Here, an example of obtaining the surface tilt (primary planar surface shape) of the mold 3 as the position of the mold 3 will be described, but the thickness (0th-order) or the secondary curved surface shape of the mold 3 may be obtained at the same time. The 0th-order component can be corrected using the position of the imprint head 4 in the Z-axis direction at the time of pressing. On the other hand, the secondary curved surface shape can be corrected by adjusting the air pressure applied to the back surface of the mask 3, or the like. Although the primary planar surface shape alone will be described here, the present invention is also effective for measurement of the above-described 0th-order component and the secondary curved surface shape.

In step S21, the processing unit 23 controls (adjusts) the distance L between the second measurement unit 9 (detection unit 22) and the mold 3 to the target distance determined using the flowchart of FIG. 6. As has been described above, control of the distance L may be performed by driving the imprint head 4 and/or the stage 6, or may be performed by the driving mechanism 24 that drives the detection unit 22. Note that a closed loop may be performed in which the control is repeated until the result of the second measurement unit 9 falls within an allowable range. As has been described above, since the range of the sensor output value in which the cyclic error becomes small has a certain degree of width, the allowable range is determined based on this. Usually, the allowable range is sufficiently a range of 100 nm to several hundred nm.

In step S22, the processing unit 23 drives the second measurement unit 9 (detection unit 22) in the X and Y directions so that the position (the position in the Z-axis direction) of the measurement target point of the mold 3 can be detected. The second measurement unit 9 can be driven by, for example, driving the stage 6 in the X and Y directions. In step S23, the processing unit 23 causes the second measurement unit 9 (detection unit 22) to detect the position of the measurement target point. In order to obtain the X-direction tilt and the Y-direction tilt of the mold, at least two measurement target points are needed in each of the X-axis direction and the Y-axis direction. For calculation of the secondary shape or the averaging effect in measurement of a plurality of points, three to five points are usually set in each of the X and Y directions in a grid. As the number of the measurement target points increases, the measurement accuracy improves, but the throughput decreases. Accordingly, suitable measurement target points are selected from the viewpoint of accuracy and time. Then, in step S24, the processing unit 23 determines whether the detection unit 22 has performed the position detection at all the set measurement target points. If the detection unit 22 has not performed the position detection at all the measurement target points, the process returns to step S22. If the detection unit 22 has performed the position detection at all the measurement target points, the process advances to step S25.

In step S25, the processing unit 23 determines the position of the mold 3 serving as the object OB based on the detection result of the detection unit 22 obtained in steps S22 to S24. The position of the mold 3 determined in step S25 can include, for example, the position (surface position) of the mold 3 in the Z-axis direction and/or the tilt (surface tilt) of the mold 3 in the ωX direction and the ωY direction. Further, the position of the mold 3 may be understood as including the surface shape of the mold 3. For example, the processing unit 23 can obtain the surface tilt of the mold 3 using a least square method based on the detection results of the detection unit 22 obtained in steps S22 to S24.

In this embodiment, as has been described above, the second measurement unit 9 (detection unit 22) is caused to detect the position of the measurement target point at the target distance determined so as to reduce the cyclic error.

That is, by using this detection result, it is possible to accurately obtain the position of the mold 3. Note that a closed loop may be performed in which the imprint head 4 is driven based on the determined position of the mold 3 and the step of measuring the surface tilt of the mask 3 is performed again.

[Imprint Process]

Figure 11:
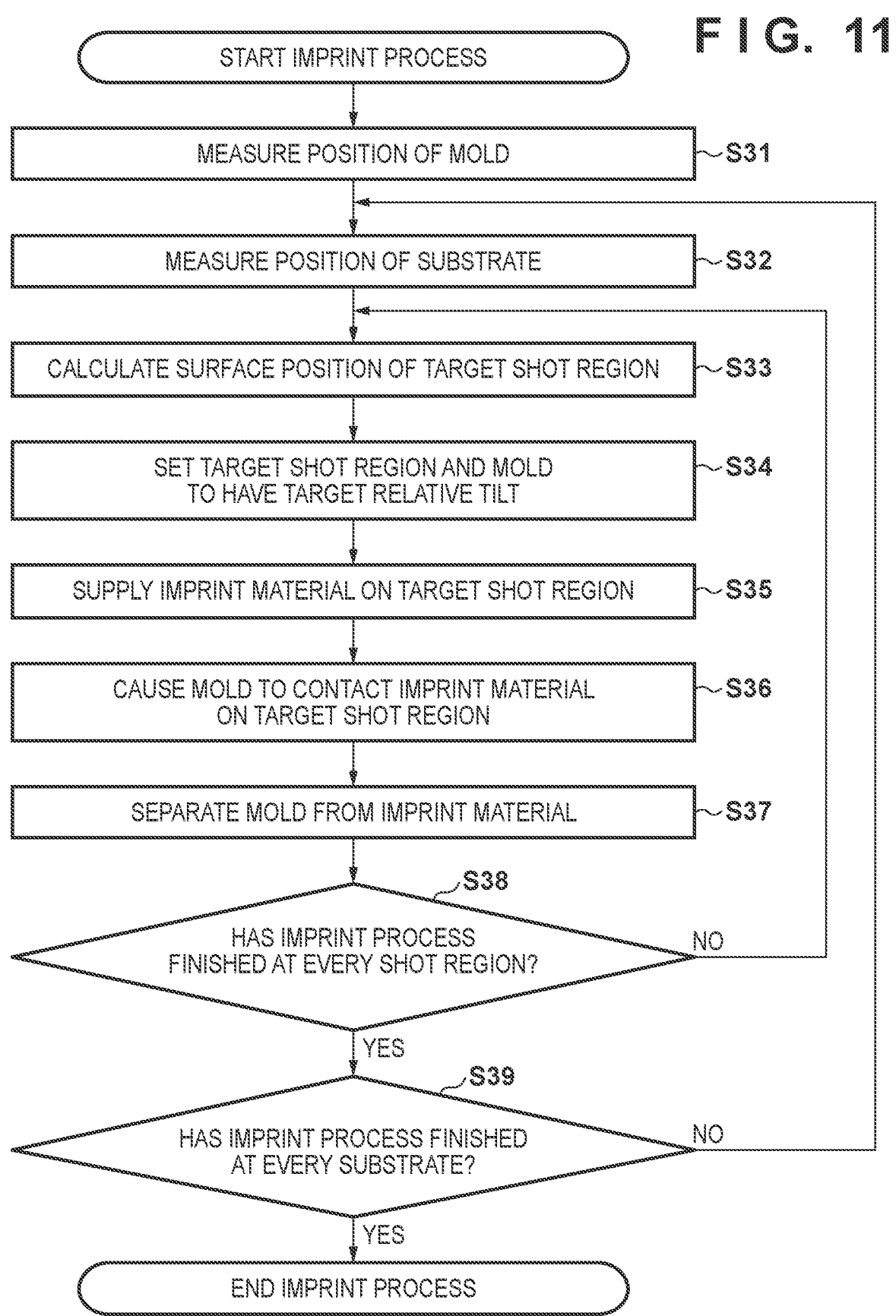
FIG. 11 is a flowchart illustrating an imprint process.

Next, an imprint process according to this embodiment will be described. FIG. 11 is a flowchart illustrating an imprint process according to this embodiment, and FIGS. 12A to 12E are conceptual views showing respective states of the imprint process according to this embodiment.

Figure 12:
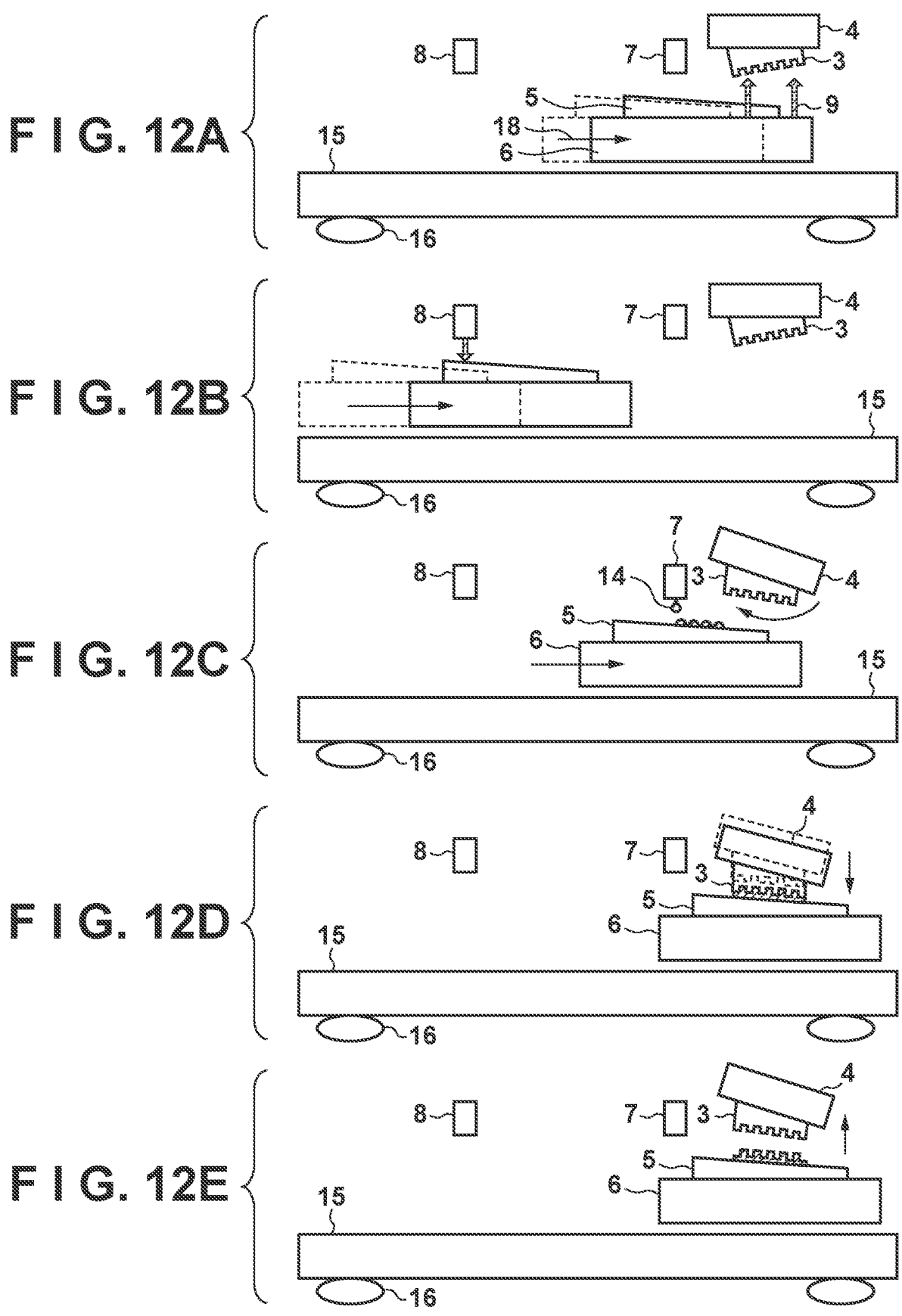
FIGS. 12A to 12E are conceptual views showing respective states of the imprint process.

In step S31, the control unit 10 causes the second measurement unit 9 to measure the position (including the surface tilt and the surface shape) of the mold 3 mounted on the imprint head 4 (see FIG. 12A). This step S31 can be performed according to the flowchart of FIG. 10 described above. With this, it is possible to reduce the influence of the cyclic error in the second measurement unit 9 and accurately measure the position of the mold 3. Then, in step S32, the control unit 10 causes the first measurement unit 8 to measure the position of the substrate 5 (including the tilt and shape of the substrate 5) mounted on the stage 6 (see FIG. 12B). Measurement of the position of the substrate 5 by the first measurement unit 8 can be performed in a manner similar to that of measurement of the position of the mold 3 by the second measurement unit 9. With this, it is possible to reduce the influence of the cyclic error in the first measurement unit 8 and accurately measure the position of the substrate 5.

In step S33, the control unit 10 calculates the surface position (tilt and shape) in a target shot region where the imprint process is to be performed. The surface position in the target shot region can be calculated by extracting a portion corresponding to the target shot region from the substrate surface shape information obtained in step S32 and performing primary planar surface approximation or the like on the extracted portion.

In step S34, the control unit 10 sets the target shot region and the surface of the mold 3 so as to have a target relative tilt (for example, parallel) (see FIG. 12C). Based on the surface position (surface tilt) in the shot region obtained in step S33 and the surface position (surface tilt) of the mold 3 obtained in step S31, the control unit 10 corrects the relative tilt between the target shot region and the mold by the imprint head 4 and/or the stage 6.

In step S35, the control unit 10 supplies the imprint material 14 onto the target shot region by the supply unit 7 (see FIG. 12C). Then, in step S36, the control unit 10 drives the mold 3 by the imprint head 4 to bring the mold 3 into contact with the imprint material 14 on the target shot region (see FIG. 12D). After waiting for the imprint material 14 to fill into the pattern of the mold 3, the control unit 10 causes the curing unit 2 to irradiate the imprint material 14 with the light 2a to cure the imprint material 14. In step S36, before curing the imprint material 14, alignment between the mold 3 and the target shot region can be also performed based on the relative positional shift between the mark of the mold 3 and the mark of the target shot region observed by the observation unit 13 (TTM scope).

In step S37, the control unit 10 separates the mold 3 from the cured imprint material 14 (see FIG. 12E). Thus, a pattern of a cured product of the imprint material 14 to which the pattern of the mold 3 has been transferred can be formed on the target shot region. Then, in step S38, the control unit 10 determines whether the imprint process has been performed in all the shot regions of the substrate 5. If there is the shot region for which the imprint process has not been performed, the process returns to step S33, and steps S33 to S37 are performed while setting, as the target shot region, the shot region for which the imprint process has not been performed. On the other hand, if the imprint process has been performed in all the shot regions, the process advances to step S39. In step S39, the control unit 10 determines whether the imprint process has been performed for all the substrates 5 in the lot. If there is the substrate 5 for which the imprint process has not been performed, the process returns to step S32, and steps S32 to S38 are performed for the substrate 5 for which the imprint process has not been performed. On the other hand, if the imprint process has been performed for all the substrates 5, the process is terminated.

Second Embodiment

The second embodiment according to the present invention will be described. Note that this embodiment basically takes over the first embodiment, and the arrangements and processing of the imprint apparatus 1 and the measurement apparatus 20 are as described in the first embodiment.

In the first embodiment described above, the case has been described in which the second measurement unit 9 accurately obtains the position of the mold 3. This also applies to a case in which the first measurement unit 8 accurately obtains the position of the substrate 5. More specifically, in the flowcharts of FIG. 6 and FIG. 10, the mold 3 is replaced with the substrate 5, the second measurement unit 9 is replaced with the first measurement unit 8, the imprint head 4 is replaced with the stage 6, and the similar steps are performed. However, in this case, it is necessary to provide a Z-axis direction driving mechanism in the stage 6.

Third Embodiment

The third embodiment according to the present invention will be described. Note that this embodiment basically takes over the first embodiment, and the arrangements and processing of the imprint apparatus 1 and the measurement apparatus 20 are as described in the first embodiment. Further, the second embodiment can be applied to this embodiment.

In the first and second embodiments, the case has been described in which the control unit 10 causes the detection unit 22 to detect the position of the measurement target point at the distance L at which the amplitude A of the waveform of the cyclic error falls within the allowable range AR, thereby reducing the cyclic error generated in the detection result. In this embodiment, a case will be described in which the cyclic error generated in the detection result of a detection unit 22 is further reduced. More specifically, in the range of a distance L in which an amplitude A falls within an allowable range AR, the processing unit 23 causes the detection unit 22 to detect the position of the measurement target point in each of a plurality of states in which the distances L are different from each other by 1/n (n≥2) of the period of the waveform (the period of the low frequency component) of the cyclic error. With this, the processing unit 23 can obtain n detection results and, based on the n detection results, determine the position of the measurement target point (object OB) so as to cancel the cyclic error.

More specifically, the processing unit 23 causes the detection unit 22 to detect the position of the measurement target point while performing fine-pitch driving of the detection unit 22 in the measurement axis direction (more specifically, the Z-axis direction) by 1/n (n≥2) of the period of the waveform (sine wave) of the cyclic error. By averaging the n detection results obtained by the above operation, the cyclic error can be reduced (canceled) As an example, when the period of the cyclic error is 300 nm, if n=2, the detection unit 22 of a second measurement unit 9 is caused to detect the position of the measurement target point at two positions in the Z-axis direction, which are the positions at +0 nm and +150 nm from the current Z position of the imprint head 4. Two detection results thus obtained include the cyclic errors in the directions (+direction and −direction) opposite to each other. Accordingly, by averaging the two detection results, it is possible to reduce (cancel) the cyclic errors included in the respective detection results and accurately obtain the position of the measurement target point. Similarly, if n=3, the detection unit 22 is caused to detect the position of the measurement target point at three positions in the Z-axis direction, which are the positions at +0 nm, +100 nm, and +200 nm from the current Z position of the imprint head 4. By averaging the three detection results thus obtained, it is possible to reduce (cancel) the cyclic error. Note that increasing the value of n improves the measurement accuracy, but it is disadvantageous in terms of throughput. Therefore, the value of n is set in the range from 2 to 4.

Figure 13:
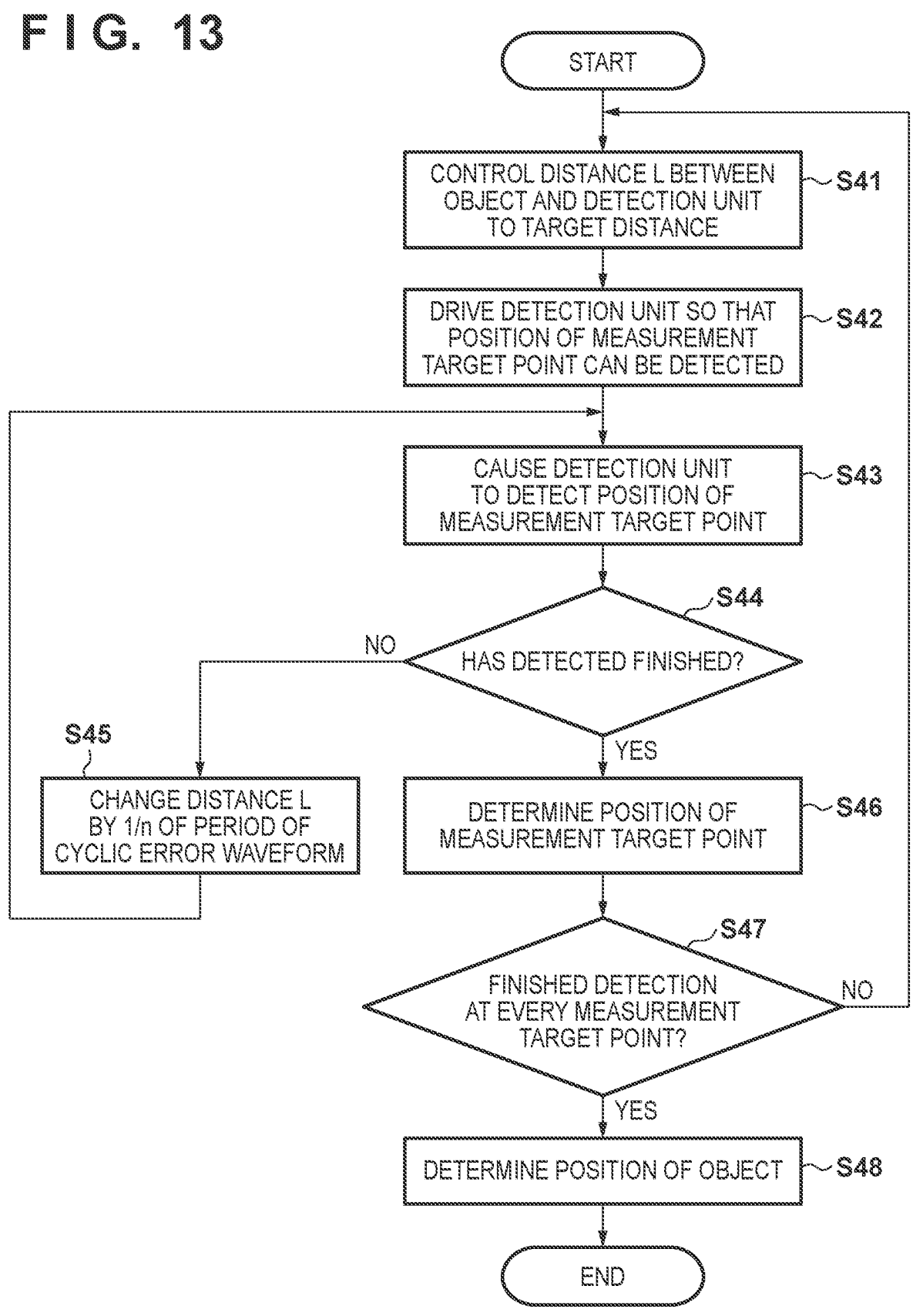
FIG. 13 is a flowchart illustrating another method of determining the position of an object.

FIG. 13 is a flowchart illustrating a method of determining the position of an object OB according to this embodiment. This flowchart is basically similar to the flowchart of FIG. 10, so that points different from the flowchart of FIG. 10 will be described below.

Steps S41 to S43 are similar to steps S21 to S23 in the flowchart of FIG. 10, so that a description thereof will be omitted. In step S44, the processing unit 23 determines whether the detection unit 22 has detected the position of the measurement target point in each of a plurality of (n) states in which the distances L are different from each other. If the position of the measurement target point has not been detected in all the states, the processing unit 23 changes the distance L by 1/n (n≥2) of the period of the waveform (sine wave) of the cyclic error in step S45, and then returns to step S43. On the other hand, if the position of the measurement target point has been detected in all the states, the process advances to step S46.

In step S46, the processing unit 23 determines the position of the measurement target point based on the n detection results obtained in the steps described above. More specifically, the processing unit 23 determines, as the position of the measurement target point, the value obtained by averaging the n detection results. With this, the cyclic error can be reduced (canceled) Since steps S47 and S48 are similar to steps S24 and S25 in the flowchart of FIG. 10, a description thereof will be omitted.

Embodiment of Method of Manufacturing Article

A method of manufacturing an article according to an embodiment of the present invention is suitable for manufacturing an article such as a microdevice such as a semiconductor device or an element having a microstructure. The method of manufacturing an article according to this embodiment includes a step of forming a pattern in an imprint material supplied (applied) onto a substrate by using the above-described imprint apparatus (imprint method), and a step of processing the substrate on which the pattern has been formed in the preceding step. This manufacturing method further includes other well-known steps (oxidation, deposition, vapor deposition, doping, planarization, etching, resist removal, dicing, bonding, packaging, and the like). The method of manufacturing an article according to this embodiment is advantageous in at least one of the performance, the quality, the productivity, and the production cost of the article, as compared to a conventional method.

The pattern of a cured product molded using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 14A:
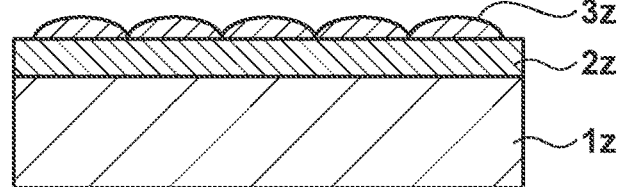
FIGS. 14A to 14F are views for explaining a method of manufacturing an article.

A more specific method of manufacturing an article will be described next. As shown FIG. 14A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 14B:
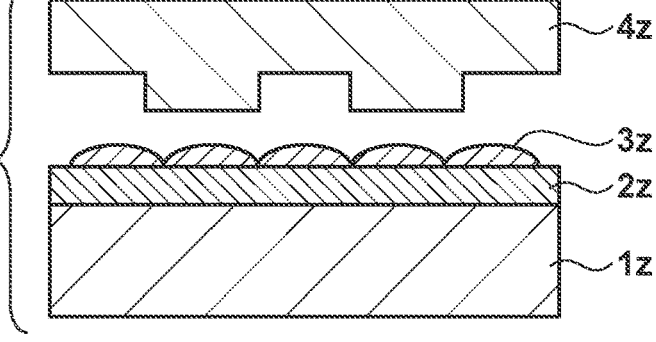
Figure 14C:
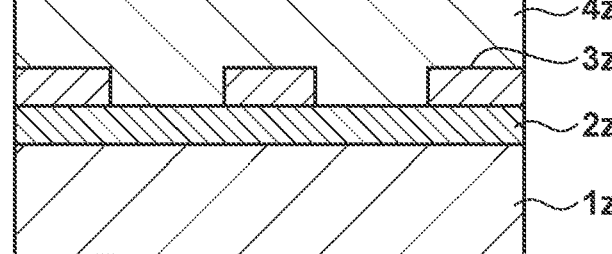

As shown in FIG. 14B, a side of a mold 4z for imprint with a pattern having concave and convex portions is directed toward and made to face the imprint material 3z on the substrate. As shown FIG. 14C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 14D:
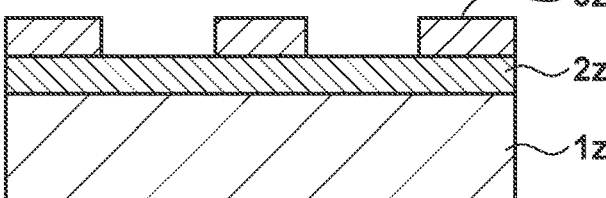

As shown in FIG. 14D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the pattern having concave and convex portions of the mold 4z is transferred to the imprint material 3z.

Figure 14E:
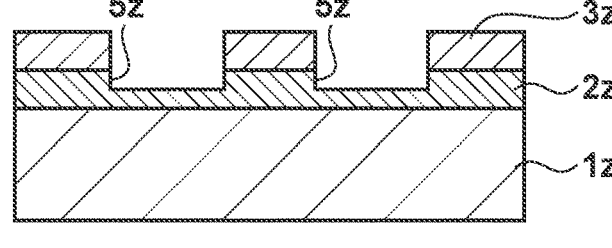
Figure 14F:
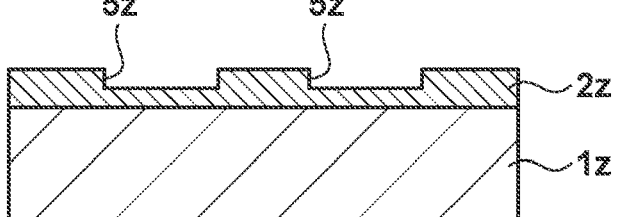

As shown in FIG. 14E, when etching is performed using the pattern of the cured product as an etching resistant mask, a portion of the surface of the processed material 2z where the cured product does not exist or remains thin is removed to form a groove 5z. As shown in FIG. 14F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

For example, the method of manufacturing an article according to the embodiment of the present invention may be used in manufacturing an article such as a metal part or an optical element. The method of manufacturing an article according to this embodiment includes a step of measuring the shape of an object using the measurement apparatus described above, and a step of processing the object based on a measurement result obtained in the measuring step. For example, the shape of the object is measured using the measurement apparatus, and the object is processed (manufactured) using the measurement result such that the shape of the object has a designed value. Also in this case, the method is advantageous in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-025523 filed on Feb. 19, 2021, which is hereby incorporated by reference herein in its entirety.

What is claimed is:

1. A measurement apparatus that measures a position of an object, comprising:
   a detector configured to irradiate a measurement target point of the object with light having a plurality of wavelengths, and detect a position of the measurement target point based on the light reflected by the measurement target point; and
   a processor configured to determine the position of the object based on a detection result of the detector, wherein the detection result includes a combined error represented by a waveform formed by a combination of cyclic errors derived from the plurality of wavelengths of the light,
   wherein an amplitude of the waveform representing the combined error cyclically changes, due to interaction of the cyclic errors derived from the plurality of wavelengths of the light, in accordance with a distance between the detector and the object, and
   wherein the processor is configured to cause the detector to detect the position of the measurement target point of the object at the distance at which the amplitude of the combined error in the waveform formed by the combination of the cyclic errors derived from the plurality of wavelengths of the light falls within an allowable range.

2. The apparatus according to claim 1, wherein the processor is configured to determine a target distance between the detector and the object such that the amplitude in the waveform of the combined error falls within the allowable range, and cause the detector to detect the position of the measurement target point at the target distance.

3. The apparatus according to claim 2, wherein the processor is configured to obtain, while changing a section for extracting a part of the waveform of the combined error, an index value indicating a magnitude of the combined error for each section to generate information indicating a relationship between the distance and the index value, and determine the target distance based on the information.

4. The apparatus according to claim 3, wherein the processor is configured to obtain, as the index value, a difference between a maximum value and a minimum value of the combined error in the section.

5. The apparatus according to claim 3, wherein the processor is configured to obtain, as the index value, a standard deviation of the combined error in the section.

6. The apparatus according to claim 3, wherein the processor is configured to obtain, as the index value, an amplitude obtained by approximating the waveform of the combined error in the section with a sine wave.

7. The apparatus according to claim 1, wherein the processor is configured to obtain n detection results ($n \geq 2$) by causing the detector to detect the position of the measurement target point in each of a plurality of states in which the distances are different from each other by $1/n$ of a period of the waveform of the combined error, and determine the position of the object based on the n detection results.

8. A lithography apparatus that forms a pattern on a substrate, comprising:
   a measurement apparatus defined in claim 1 that measures a position of an object; and
   a controller configured to control, based on a measurement result of the measurement apparatus, formation of the pattern on the substrate,
   wherein the measurement apparatus measures, as the position of the object, a position of the substrate and/or a position of an original including a pattern to be transferred to the substrate.

9. A method of manufacturing an article, the method comprising:
   measuring a position of an object by using a measurement apparatus according to claim 1;
   processing the object based on a result of measuring the position of the object, to manufacture the article.

* * * * *